(12) United States Patent
Tai et al.

(10) Patent No.: US 9,882,031 B2
(45) Date of Patent: *Jan. 30, 2018

(54) METHOD OF MANUFACTURING A HORIZONTAL GATE-ALL-AROUND TRANSISTOR HAVING A FIN

(71) Applicant: Taiwan Semiconductor Manufacturing Company Limited, Hsinchu (TW)

(72) Inventors: Chia-Cheng Tai, Hsinchu (TW); Chun-Liang Tai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/218,146

(22) Filed: Jul. 25, 2016

(65) Prior Publication Data

US 2016/0336430 A1    Nov. 17, 2016

Related U.S. Application Data

(63) Continuation of application No. 14/504,506, filed on Oct. 2, 2014, now Pat. No. 9,406,749.

(51) Int. Cl.
| | |
|---|---|
| *H01L 29/66* | (2006.01) |
| *H01L 21/306* | (2006.01) |
| *H01L 29/78* | (2006.01) |
| *H01L 29/423* | (2006.01) |
| *H01L 21/311* | (2006.01) |
| *H01L 29/06* | (2006.01) |
| *H01L 29/786* | (2006.01) |
| *H01L 21/02* | (2006.01) |

(Continued)

(52) U.S. Cl.
CPC ........ *H01L 29/66818* (2013.01); *B82Y 10/00* (2013.01); *H01L 21/02057* (2013.01); *H01L 21/02233* (2013.01); *H01L 21/02236* (2013.01); *H01L 21/02238* (2013.01); *H01L 21/02252* (2013.01); *H01L 21/30604* (2013.01); *H01L 21/31111* (2013.01); *H01L 29/0673* (2013.01); *H01L 29/0676* (2013.01); *H01L 29/401* (2013.01); *H01L 29/42392* (2013.01); *H01L 29/66439* (2013.01); *H01L 29/66484* (2013.01); *H01L 29/66666* (2013.01); *H01L 29/66742* (2013.01); *H01L 29/785* (2013.01); *H01L 29/78642* (2013.01)

(58) Field of Classification Search
CPC ......... H01L 29/66795; H01L 29/42376; H01L 29/772
USPC ......................................................... 438/289
See application file for complete search history.

(56) References Cited

U.S. PATENT DOCUMENTS

| | | | |
|---|---|---|---|
| 9,406,749 B2* | 8/2016 | Tai ....................... | H01L 29/0676 |
| 2008/0196743 A1* | 8/2008 | Shibata ............... | H01L 21/6708 134/3 |
| 2011/0193178 A1 | 8/2011 | Chang et al. | |

(Continued)

*Primary Examiner* — Evan Pert
*Assistant Examiner* — Changhyun Yi
(74) *Attorney, Agent, or Firm* — Jones Day

(57) ABSTRACT

A semiconductor structure includes a substrate and a fin. The fin extends from the substrate and is formed with a hole therethrough. The hole is defined by a confronting pair of wall parts. One of the wall parts is more arcuate than the other of the wall parts. A method for fabricating the semiconductor structure is also disclosed.

20 Claims, 21 Drawing Sheets

(51) Int. Cl.
*B82Y 10/00* (2011.01)
*H01L 29/40* (2006.01)

(56) References Cited

U.S. PATENT DOCUMENTS

| | | | |
|---|---|---|---|
| 2013/0137275 A1* | 5/2013 | Tong | H01L 21/32134 438/722 |
| 2015/0021663 A1* | 1/2015 | Akarvardar | H01L 29/785 257/192 |
| 2015/0187909 A1 | 7/2015 | Yan et al. | |

* cited by examiner

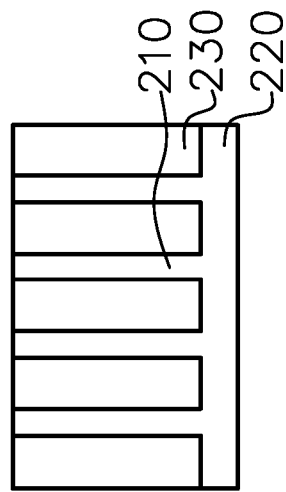
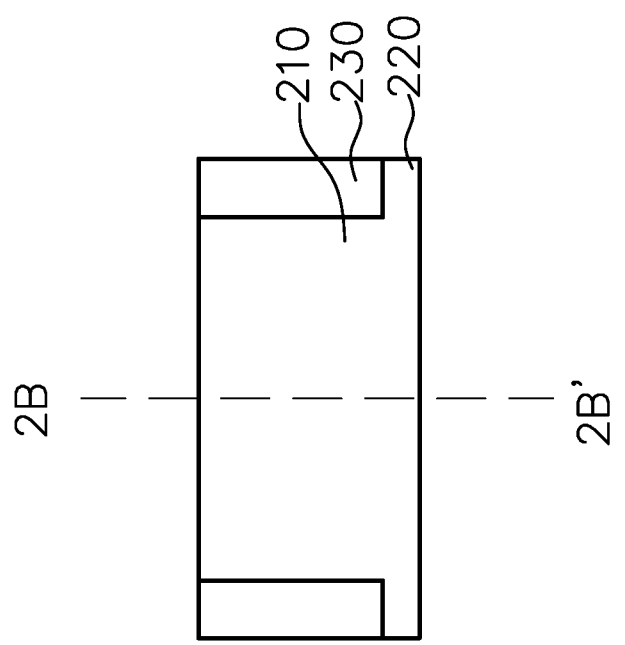
Fig.2B
Fig.2A

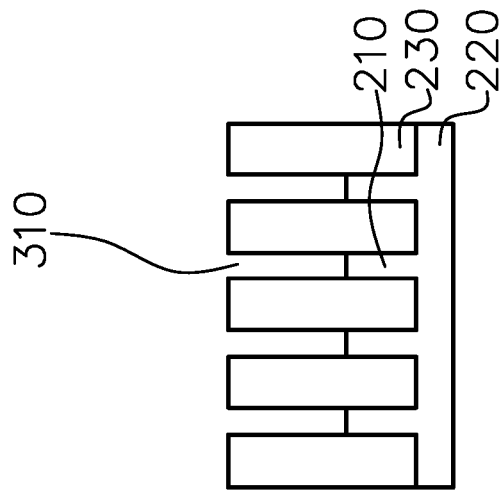
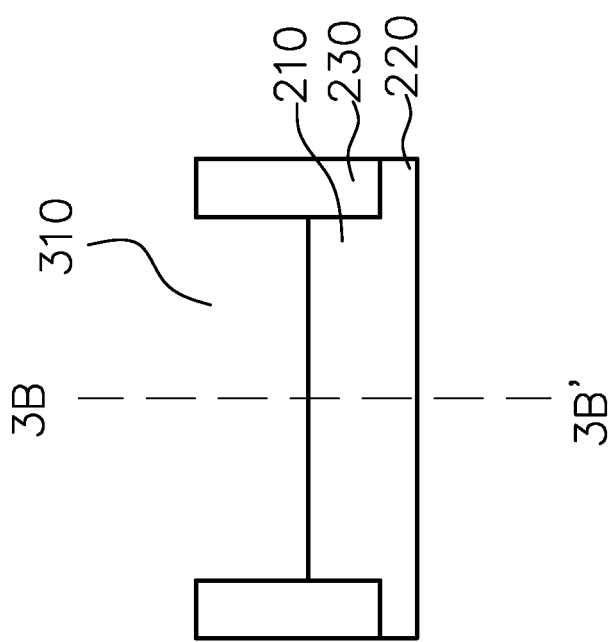
Fig.3B
Fig.3A

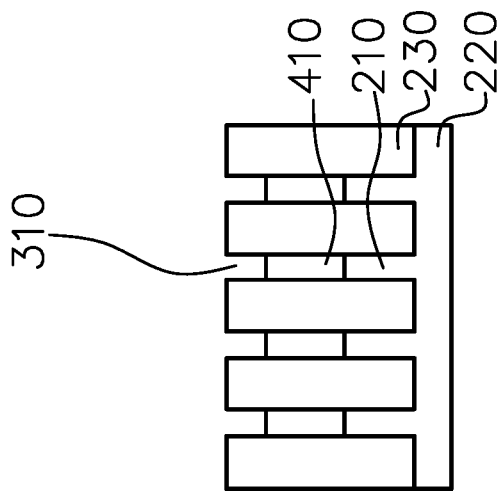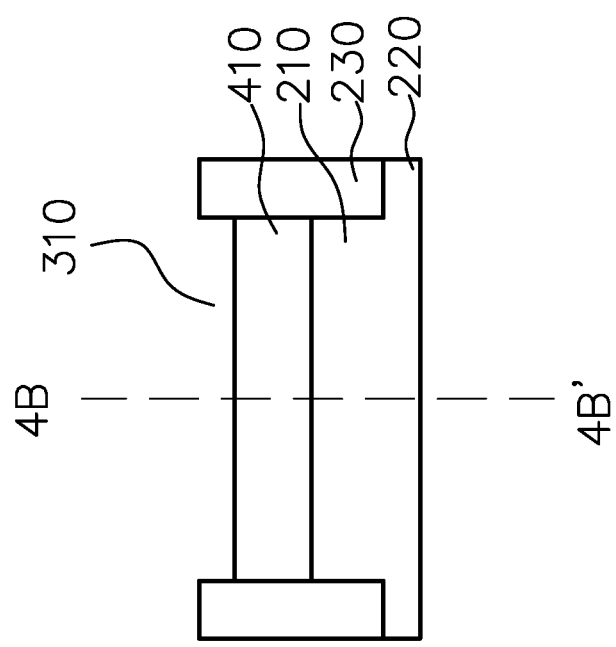

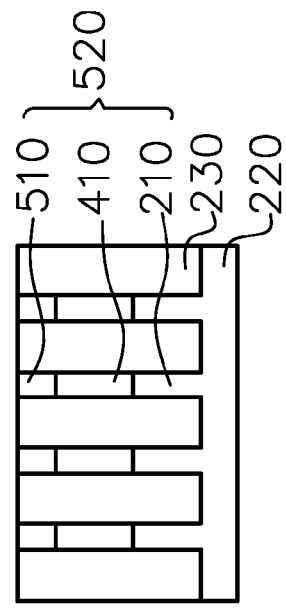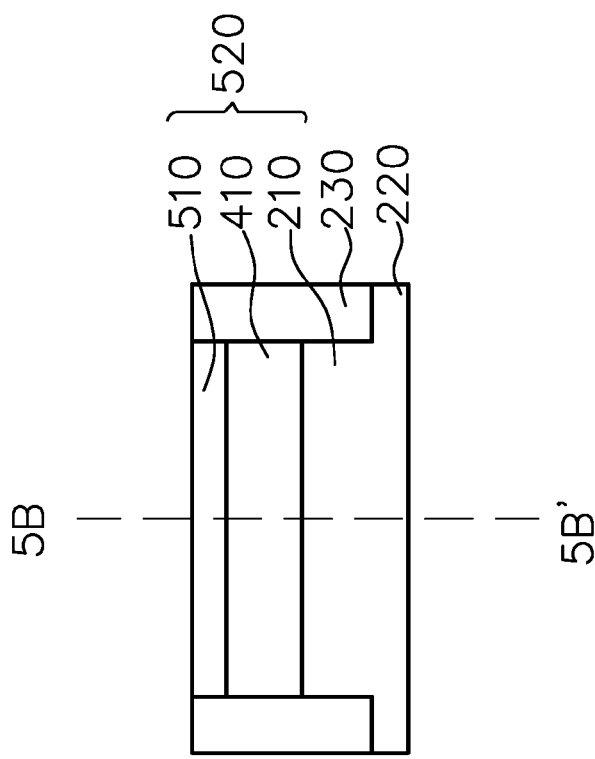

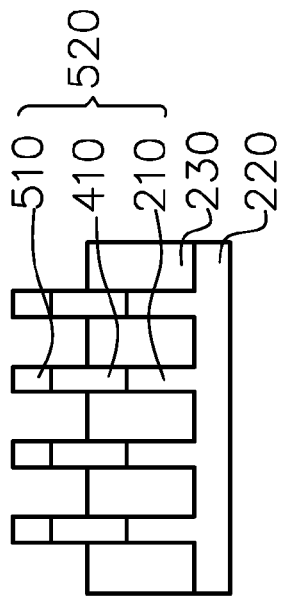
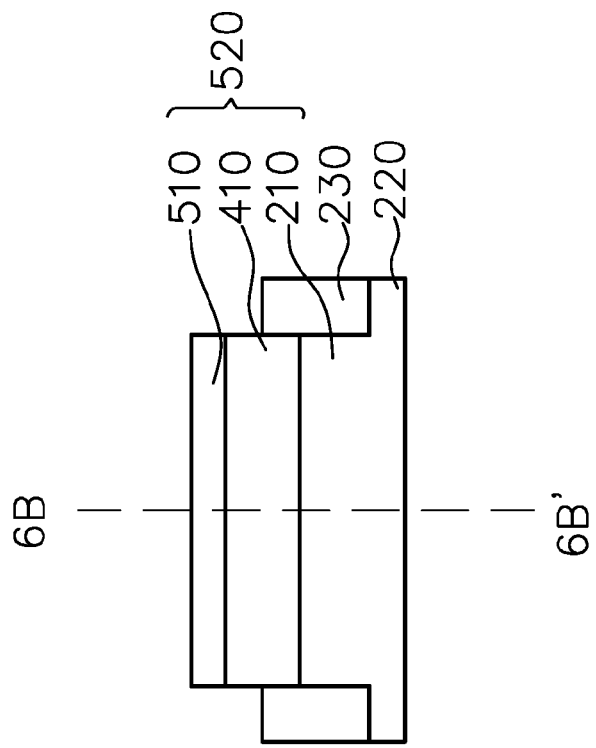
Fig.6B
Fig.6A

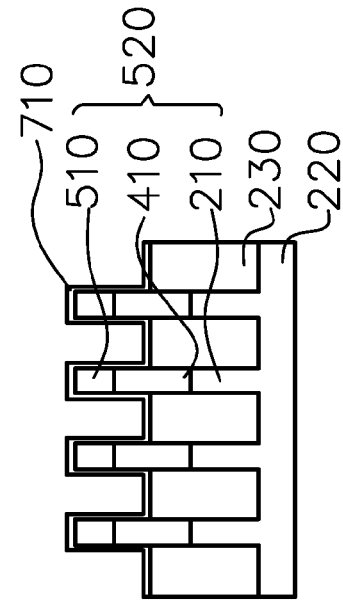
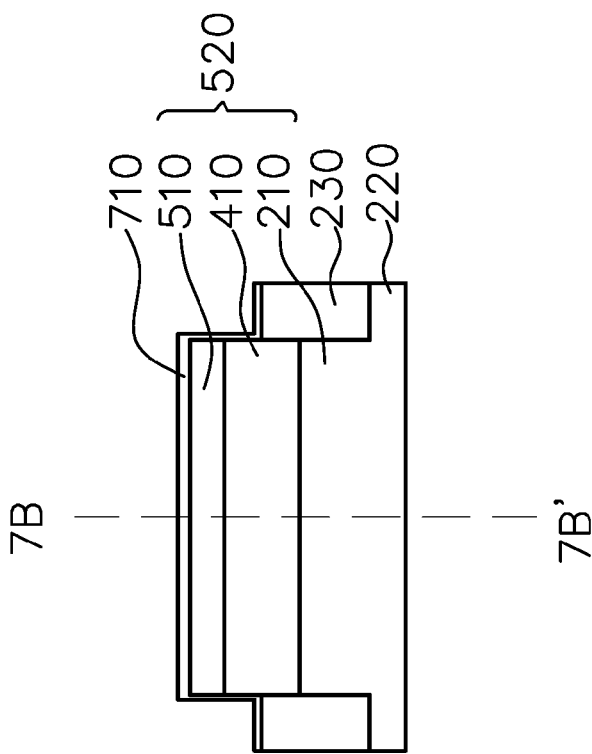
Fig.7B
Fig.7A

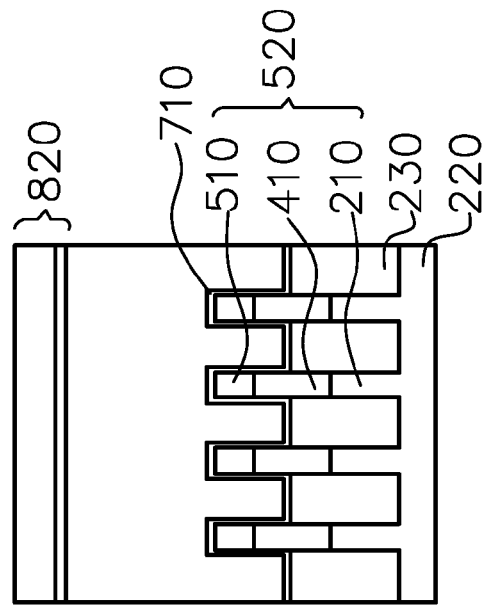
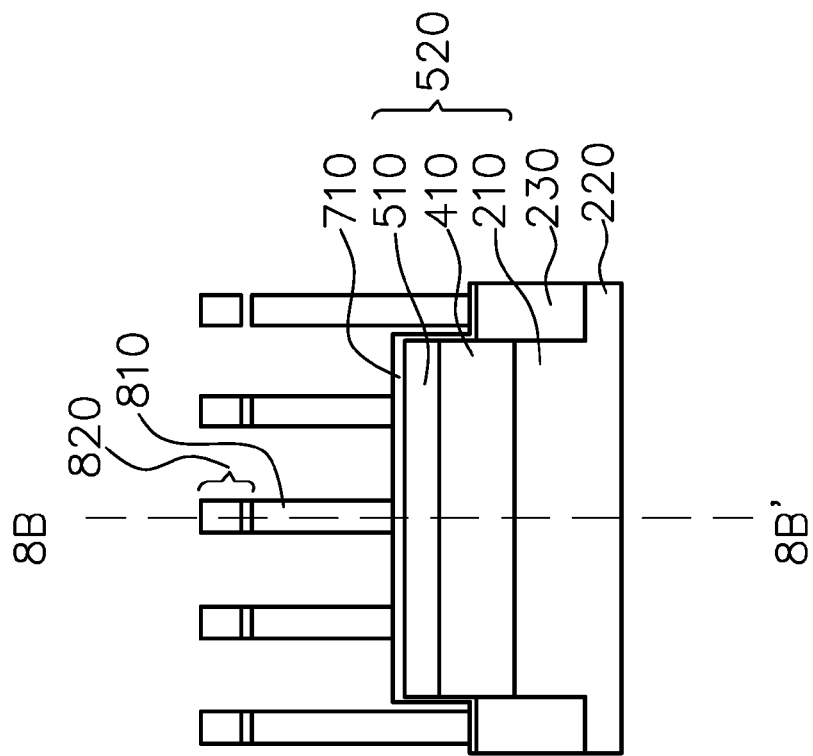

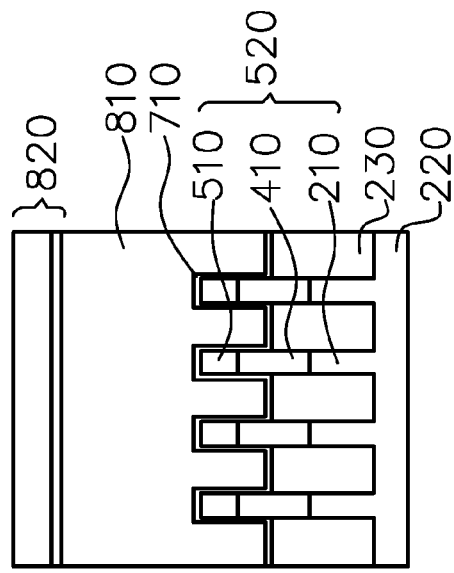
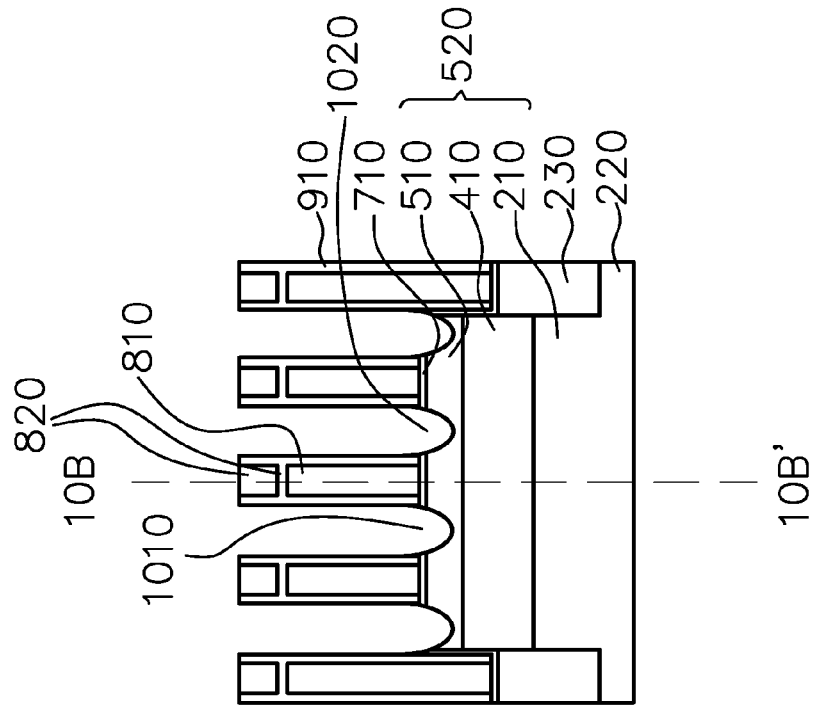
Fig.10B
Fig.10A

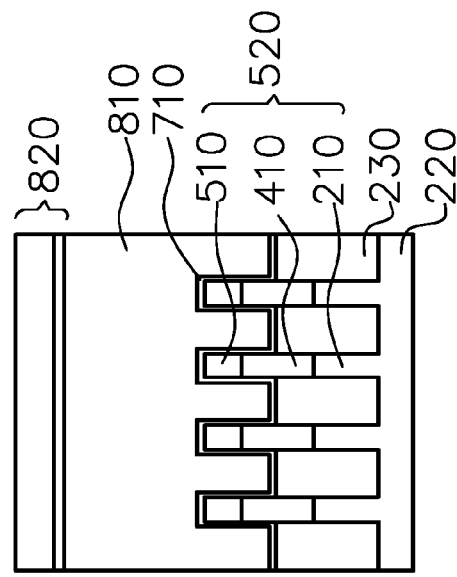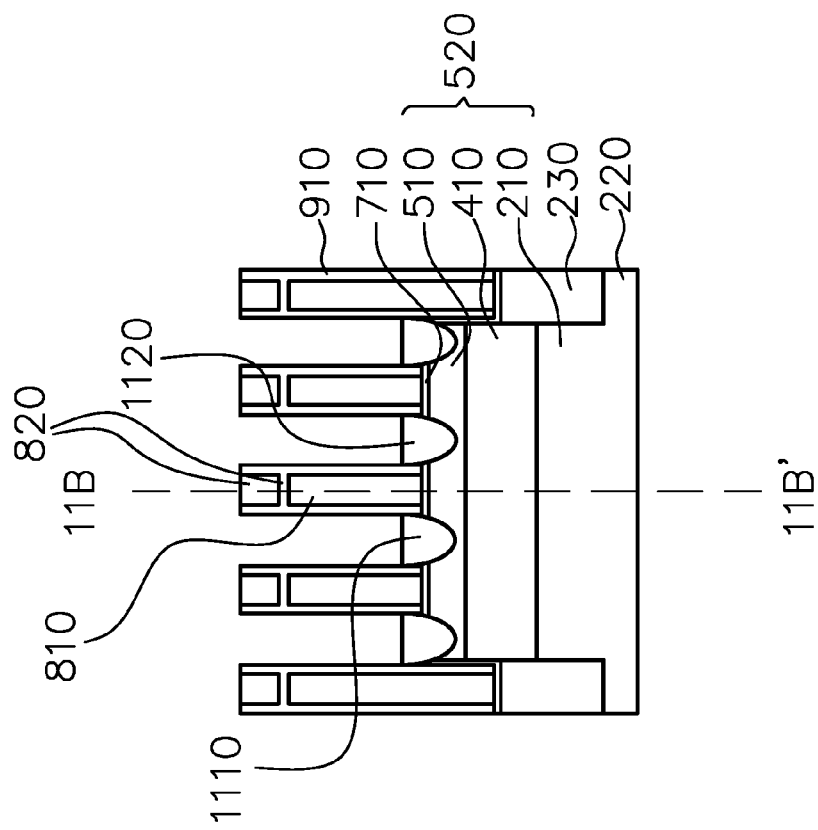
Fig.11B
Fig.11A

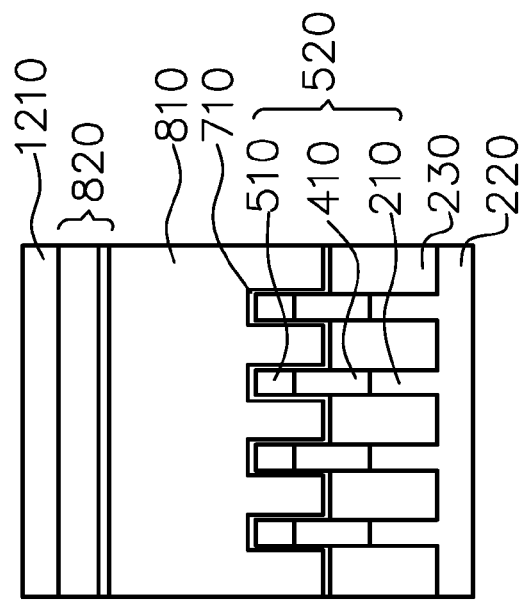
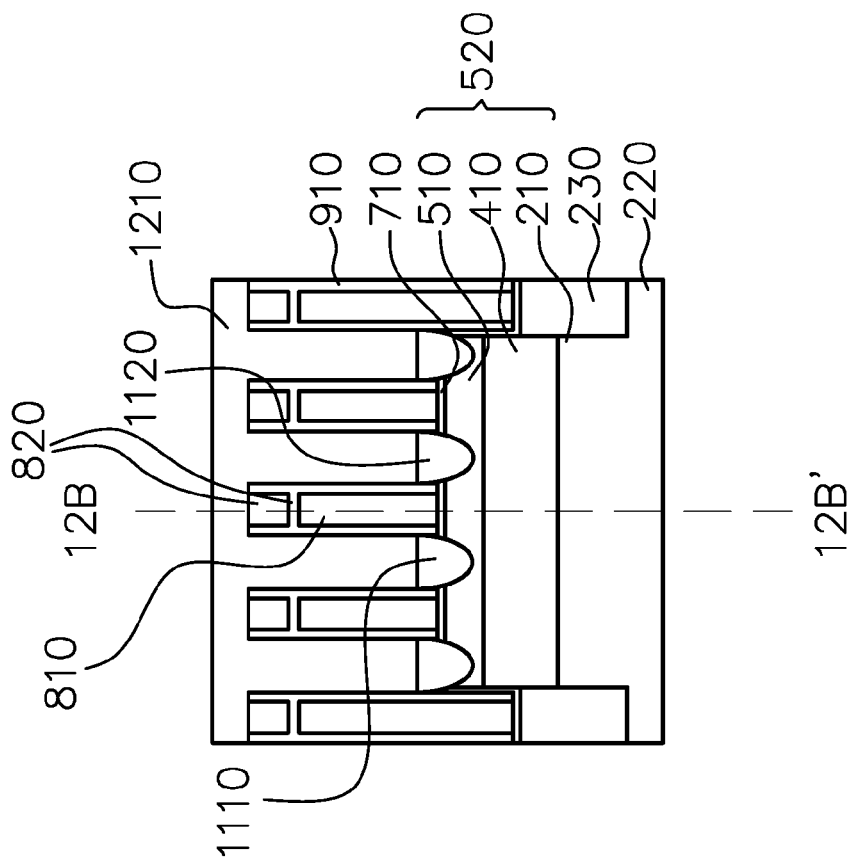
Fig.12B
Fig.12A

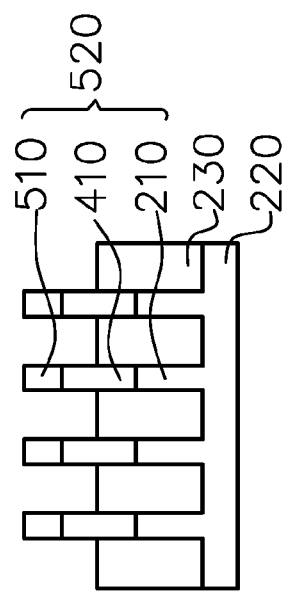
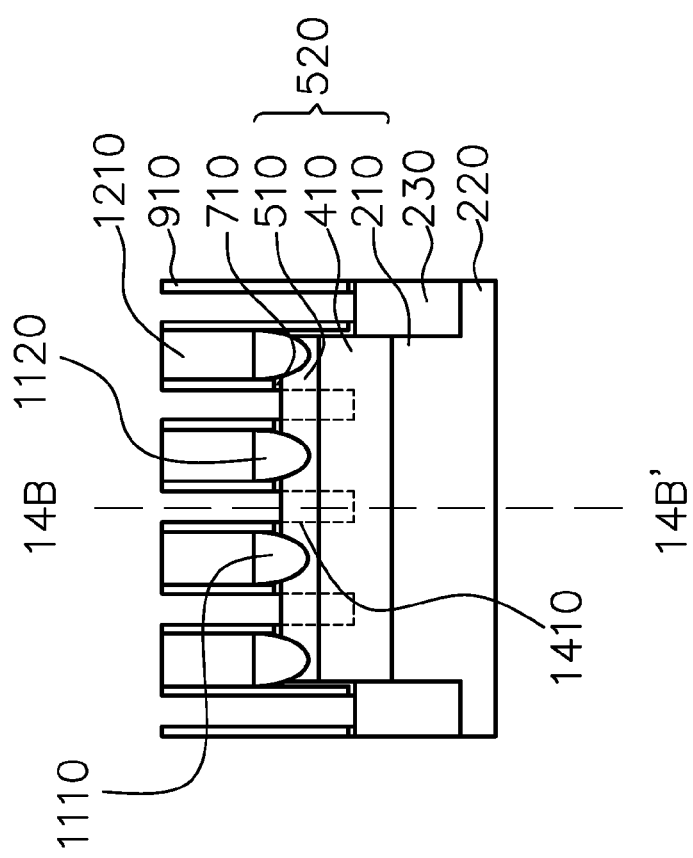
Fig.14B
Fig.14A

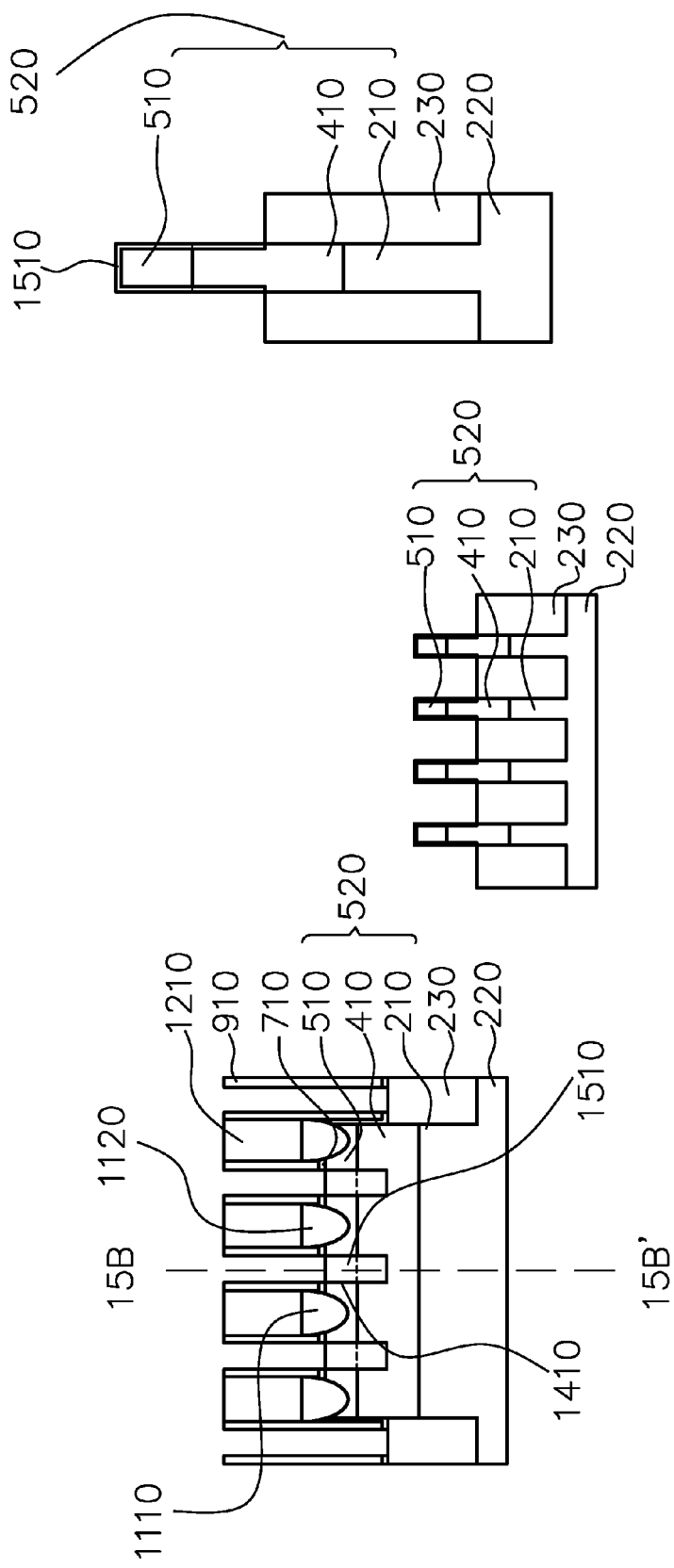

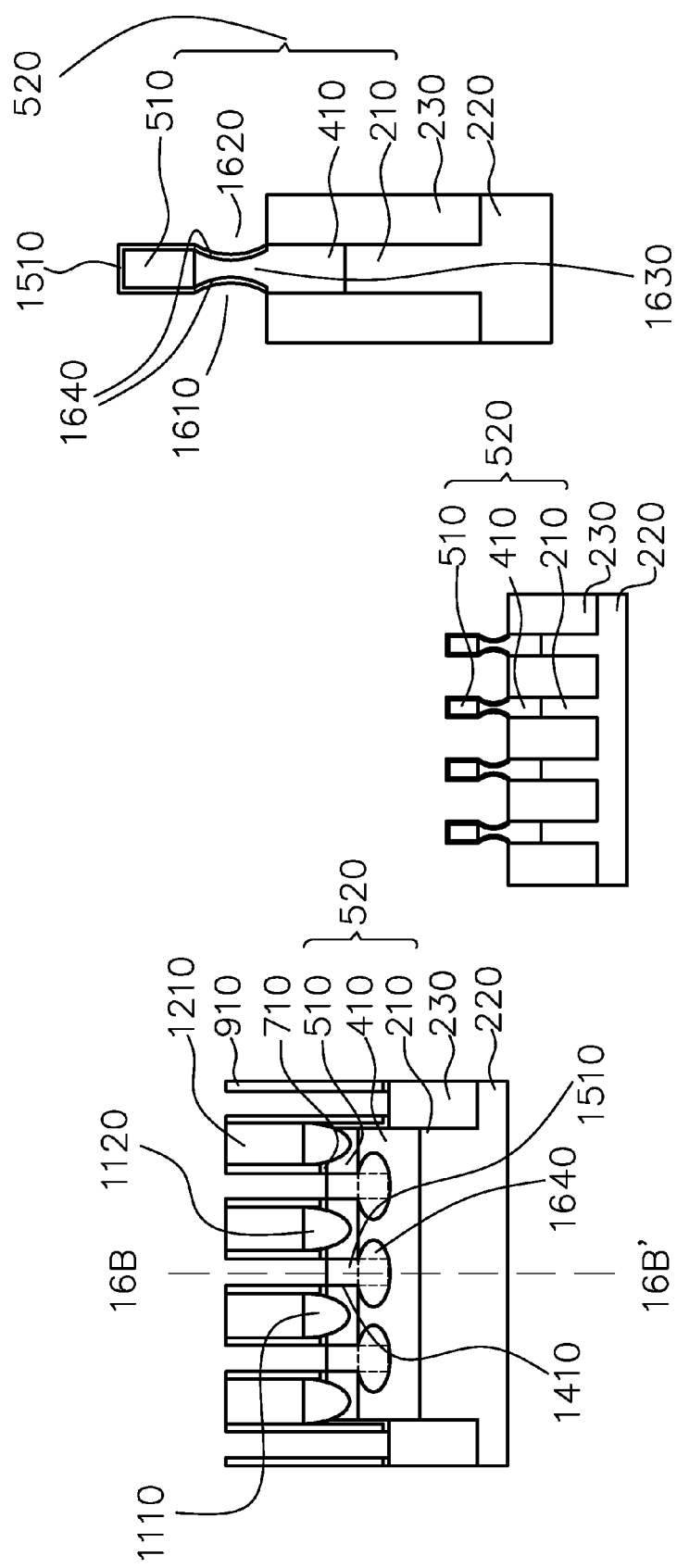

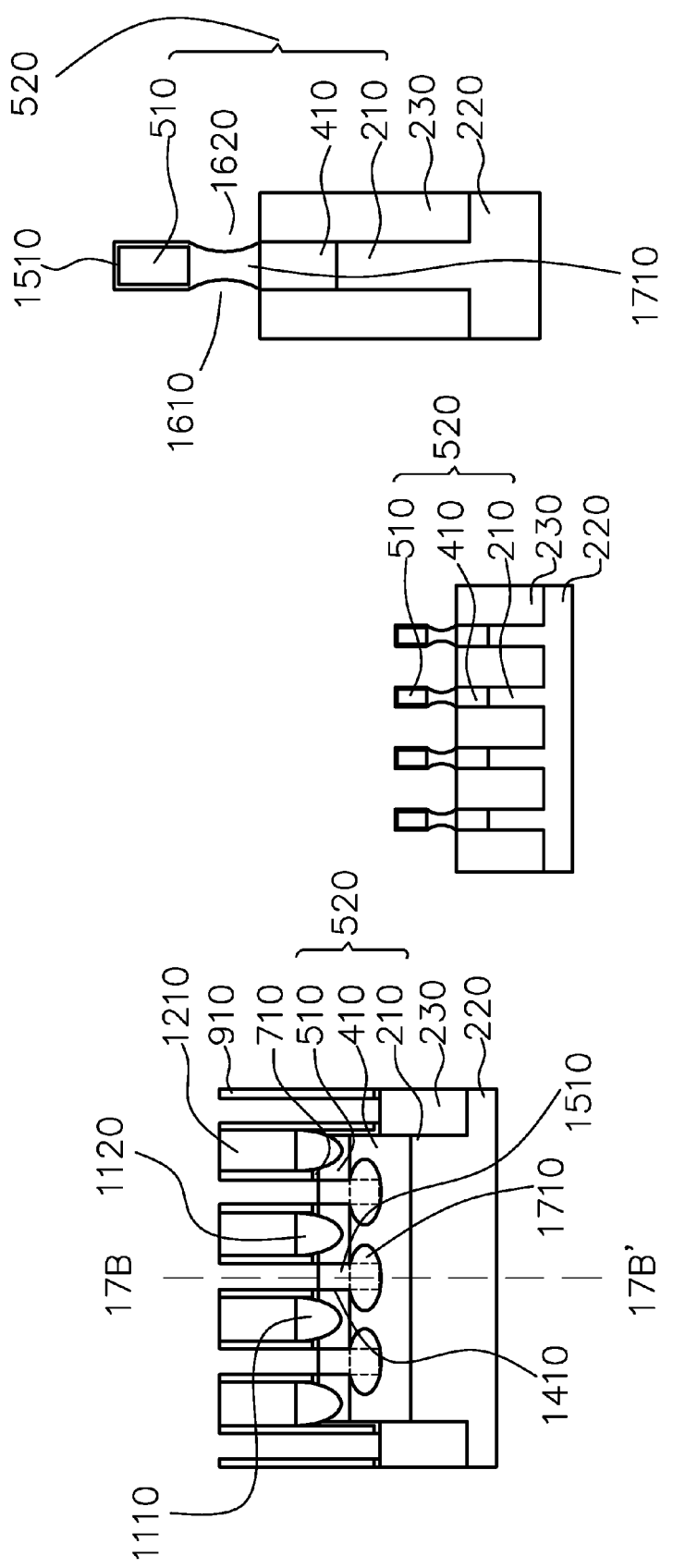

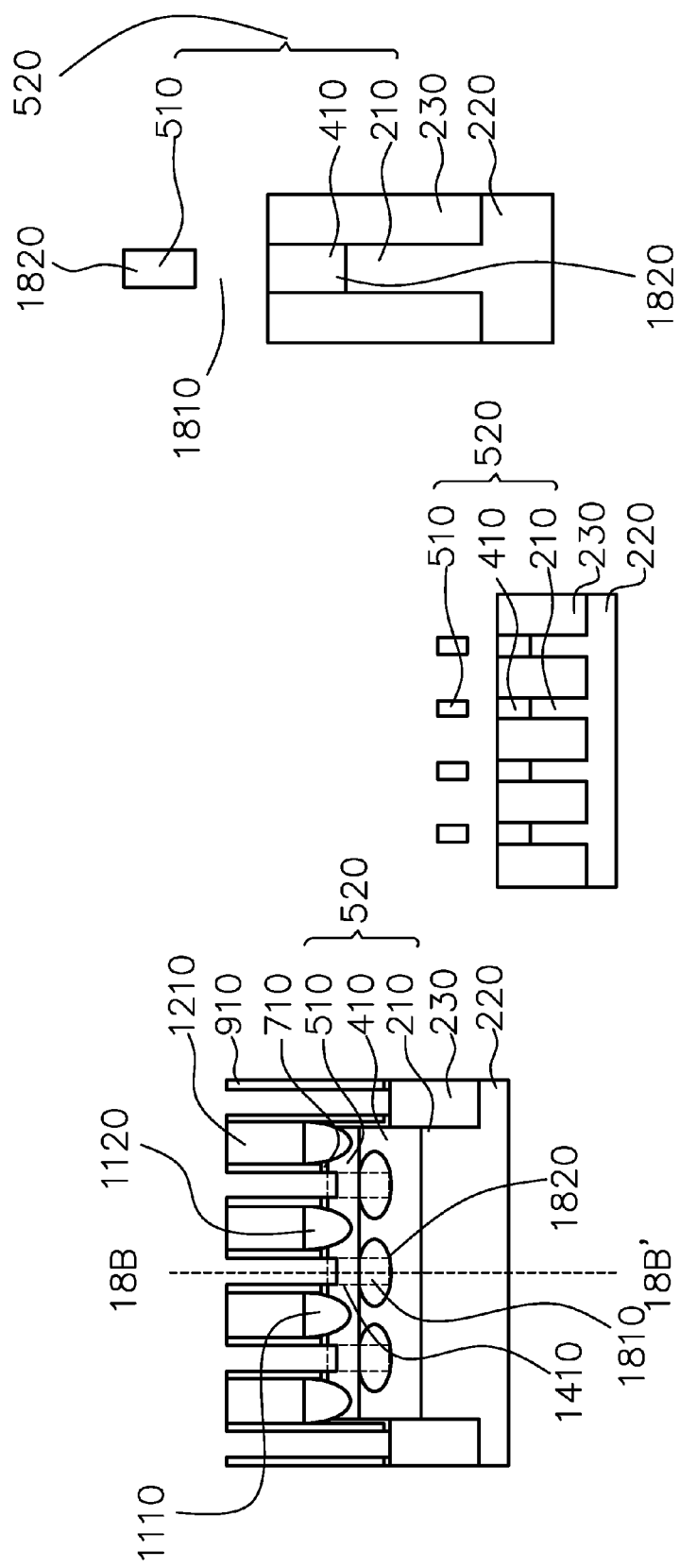

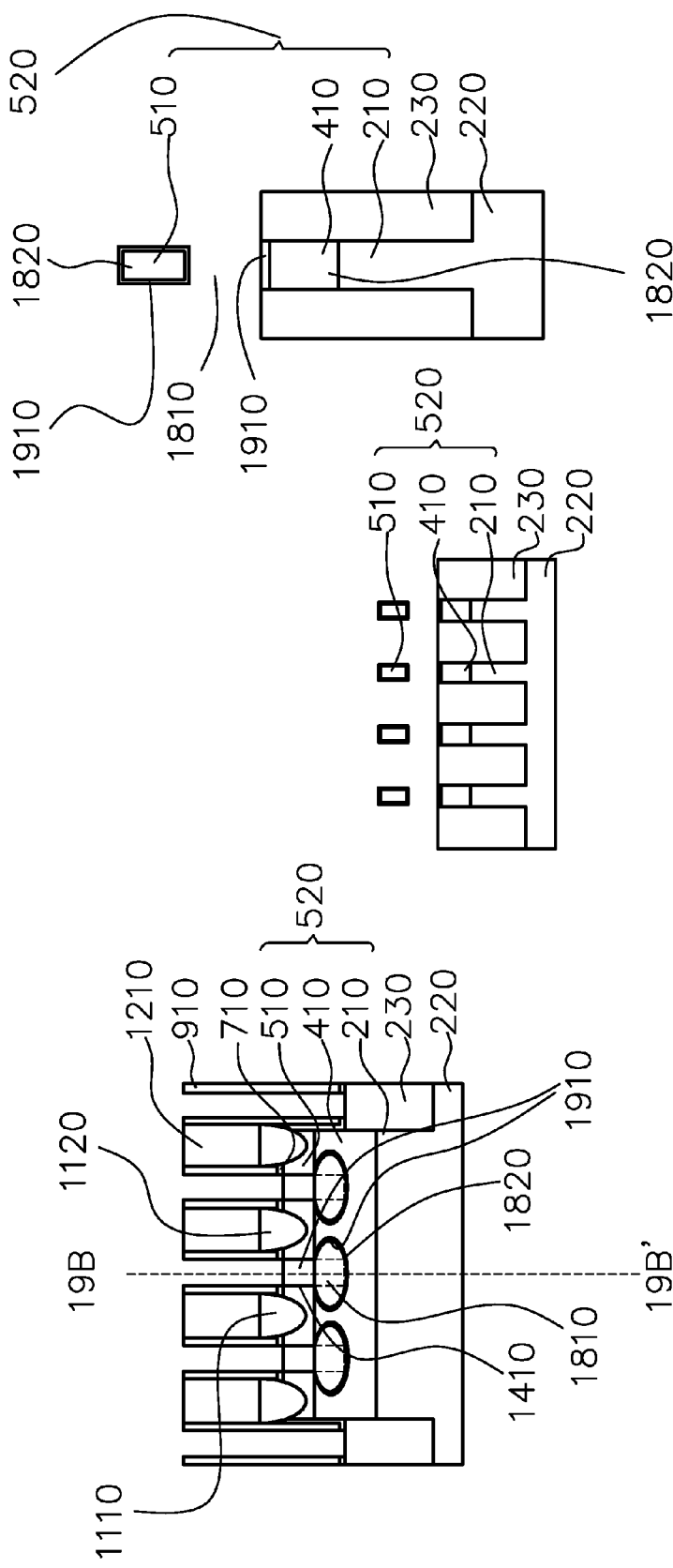

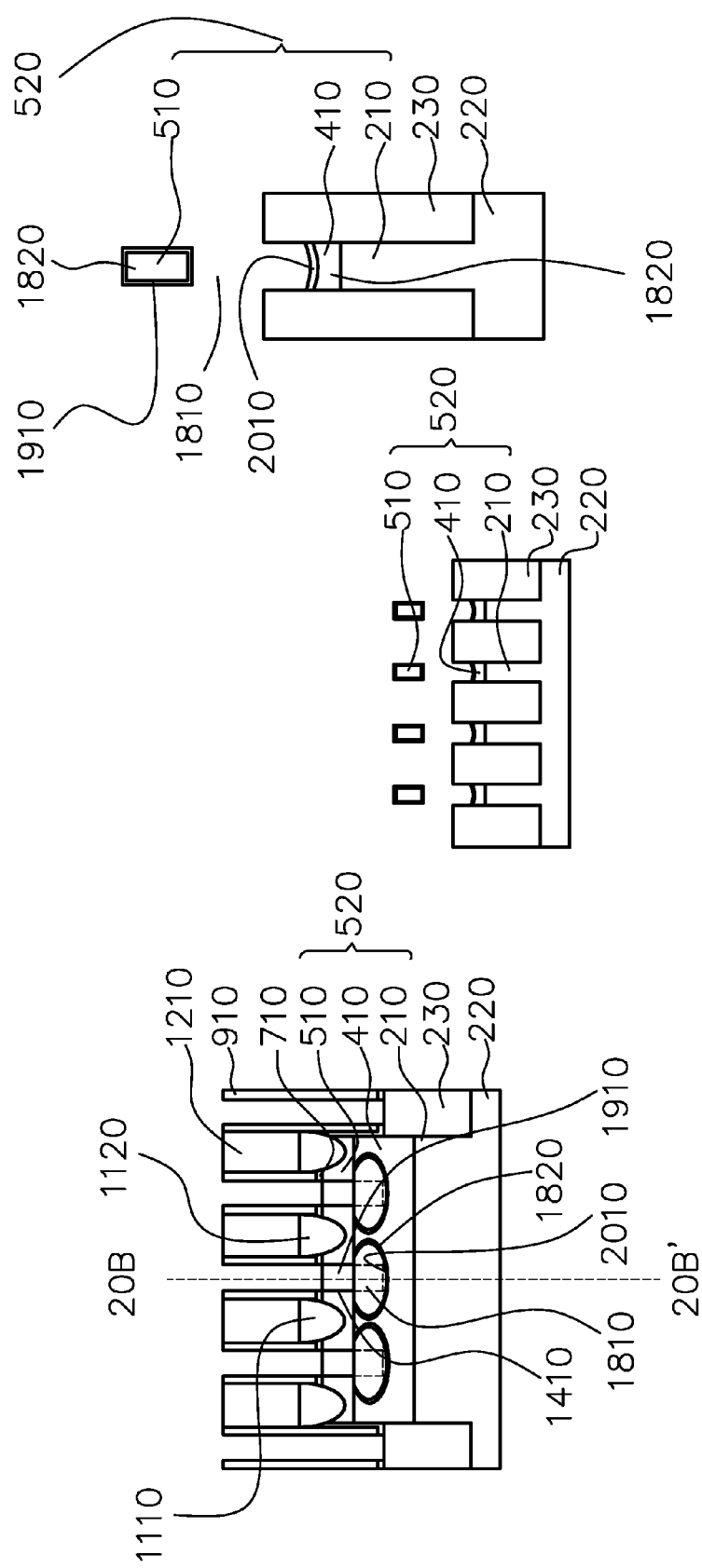

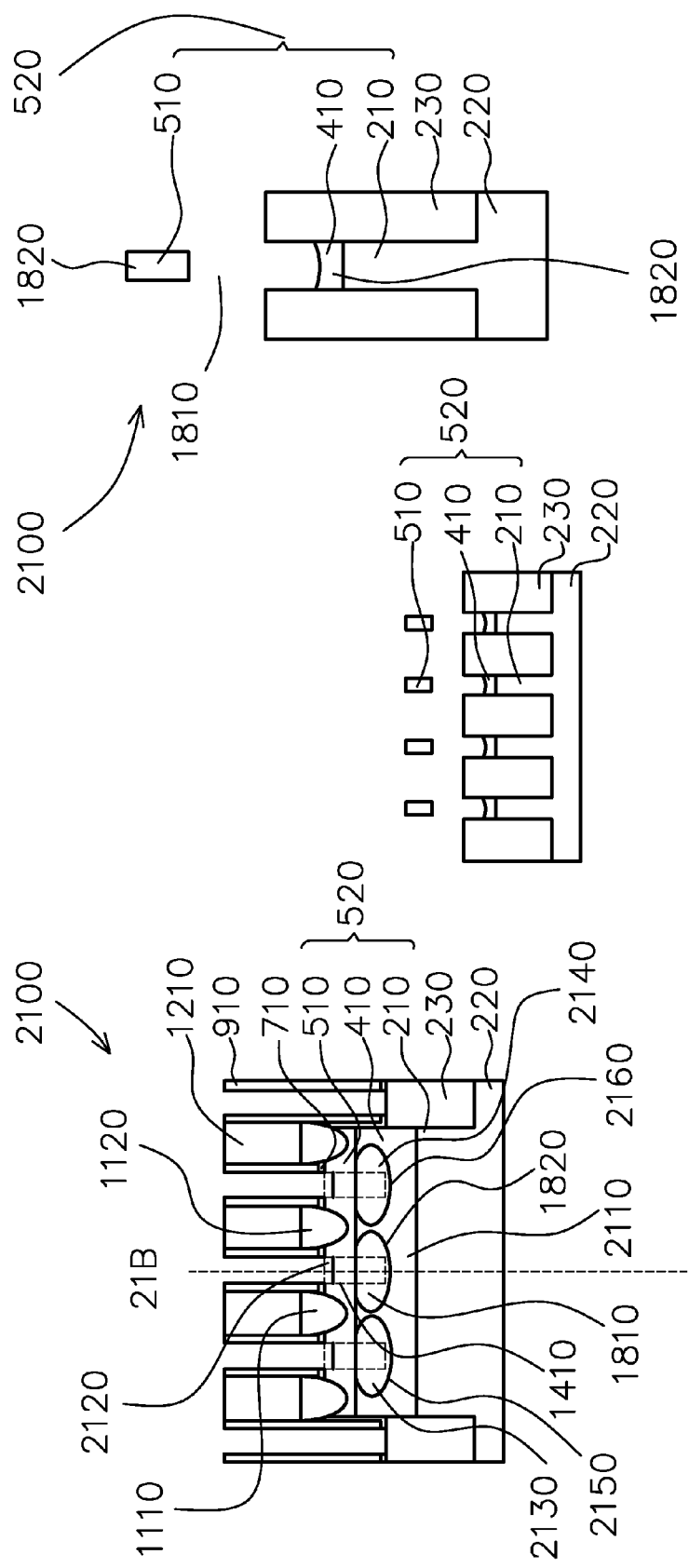

METHOD OF MANUFACTURING A HORIZONTAL GATE-ALL-AROUND TRANSISTOR HAVING A FIN

CROSS-REFERENCE TO RELATED APPLICATION

This is a continuation of U.S. application Ser. No. 14/504,506, filed Oct. 2, 2014, hereby incorporated herein by reference.

BACKGROUND

The present disclosure relates to a semiconductor structure, more particularly to a semiconductor structure suitable for used in forming transistors, such as gate all around (GAA) transistors.

A GAA transistor includes a pair of source/drain regions, a nanowire that interconnects the source/drain regions, and a gate stack that surrounds the nanowire. The GAA transistor is an emerging technology in the semiconductor industry. It is therefore desirable to provide a semiconductor structure, and a method for fabrication thereof, in which a transistor of enhanced performance may be formed, such as a GAA transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a schematic longitudinal sectional view illustrating a stage in the fabrication of an exemplary semiconductor structure in accordance with some embodiments.

FIG. 2B is a schematic sectional view taken along line 2B-2B' of FIG. 2A in accordance with some embodiments.

FIG. 3A is a schematic longitudinal sectional view illustrating another stage in the fabrication of the exemplary semiconductor structure in accordance with some embodiments.

FIG. 3B is a schematic sectional view taken along line 3B-3B' of FIG. 3A in accordance with some embodiments.

FIG. 4A is a schematic longitudinal sectional view illustrating another stage in the fabrication of the exemplary semiconductor structure in accordance with some embodiments.

FIG. 4B is a schematic sectional view taken along line 4B-4B' of FIG. 4A in accordance with some embodiments.

FIG. 5A is a schematic longitudinal sectional view illustrating another stage in the fabrication of the exemplary semiconductor structure in accordance with some embodiments.

FIG. 5B is a schematic sectional view taken along line 5B-5B' of FIG. 5A in accordance with some embodiments.

FIG. 6A is a schematic longitudinal sectional view illustrating another stage in the fabrication of the exemplary semiconductor structure in accordance with some embodiments.

FIG. 6B is a schematic sectional view taken along line 6B-6B' of FIG. 6A in accordance with some embodiments.

FIG. 7A is a schematic longitudinal sectional view illustrating another stage in the fabrication of the exemplary semiconductor structure in accordance with some embodiments.

FIG. 7B is a schematic sectional view taken along line 7B-7B' of FIG. 7A in accordance with some embodiments.

FIG. 8A is a schematic longitudinal sectional view illustrating another stage in the fabrication of the exemplary semiconductor structure in accordance with some embodiments.

FIG. 8B is a schematic sectional view taken along line 8B-8B' of FIG. 8A in accordance with some embodiments.

FIG. 10A is a schematic longitudinal sectional view illustrating another stage in the fabrication of the exemplary semiconductor structure in accordance with some embodiments.

FIG. 10B is a schematic sectional view taken along line 10B-10B' of FIG. 10A in accordance with some embodiments.

FIG. 11A is a schematic longitudinal sectional view illustrating another stage in the fabrication of the exemplary semiconductor structure in accordance with some embodiments.

FIG. 11B is a schematic sectional view taken along line 11B-11B' of FIG. 11A in accordance with some embodiments.

FIG. 12A is a schematic longitudinal sectional view illustrating another stage in the fabrication of the exemplary semiconductor structure in accordance with some embodiments.

FIG. 12B is a schematic sectional view taken along line 12B-12B' of FIG. 12A in accordance with some embodiments.

FIG. 14A is a schematic longitudinal sectional view illustrating another stage in the fabrication of the exemplary semiconductor structure in accordance with some embodiments.

FIG. 14B is a schematic sectional view taken along line 14B-14B' of FIG. 14A in accordance with some embodiments.

FIG. 15A is a schematic longitudinal sectional view illustrating another stage in the fabrication of the exemplary semiconductor structure in accordance with some embodiments.

FIG. 15B is a schematic sectional view taken along line 15B-15B' of FIG. 15A in accordance with some embodiments.

FIG. 15C is a magnified schematic sectional view of a fin shown in FIG. 15B in accordance with some embodiments.

FIG. 16A is a schematic longitudinal sectional view illustrating another stage in the fabrication of the exemplary semiconductor structure in accordance with some embodiments.

FIG. 16B is a schematic sectional view taken along line 16B-16B' of FIG. 16A in accordance with some embodiments.

FIG. 16C is a magnified schematic sectional view of a fin shown in FIG. 16B in accordance with some embodiments.

FIG. 17A is a schematic longitudinal sectional view illustrating another stage in the fabrication of the exemplary semiconductor structure in accordance with some embodiments.

FIG. 17B is a schematic sectional view taken along line 17B-17B' of FIG. 17A in accordance with some embodiments.

FIG. 17C is a magnified schematic sectional view of a fin shown in FIG. 17B in accordance with some embodiments.

FIG. 18A is a schematic longitudinal sectional view illustrating another stage in the fabrication of the exemplary semiconductor structure in accordance with some embodiments.

FIG. 18B is a schematic sectional view taken along line 18B-18B' of FIG. 18A in accordance with some embodiments.

FIG. 18C is a magnified schematic sectional view of a fin shown in FIG. 18B in accordance with some embodiments.

FIG. 19A is a schematic longitudinal sectional view illustrating another stage in the fabrication of the exemplary semiconductor structure in accordance with some embodiments.

FIG. 19B is a schematic sectional view taken along line 19B-19B' of FIG. 19A in accordance with some embodiments.

FIG. 19C is a magnified schematic sectional view of a fin shown in FIG. 19B in accordance with some embodiments.

FIG. 20A is a schematic longitudinal sectional view illustrating another stage in the fabrication of the exemplary semiconductor structure in accordance with some embodiments.

FIG. 20B is a schematic sectional view taken along line 20B-20B' of FIG. 20A in accordance with some embodiments.

FIG. 20C is a magnified schematic sectional view of a fin shown in FIG. 20B in accordance with some embodiments.

FIG. 21A is a schematic longitudinal sectional view illustrating another stage in the fabrication of the exemplary semiconductor structure in accordance with some embodiments.

FIG. 21B is a schematic sectional view taken along line 21B-21B' of FIG. 21A in accordance with some embodiments.

FIG. 21C is a magnified schematic sectional view of a fin shown in FIG. 21B in accordance with some embodiments.

DETAILED DESCRIPTION

Figure 1:
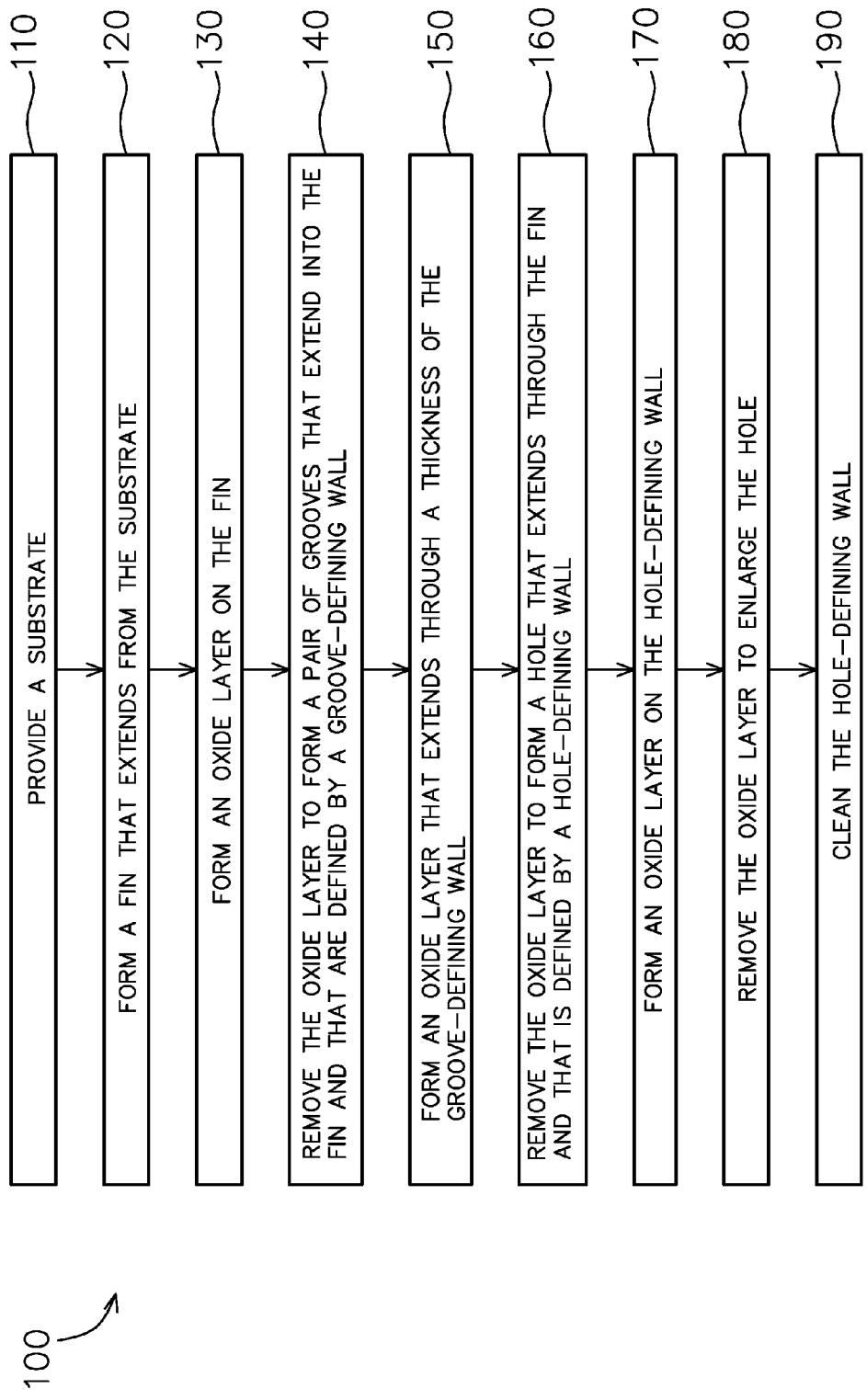
FIG. 1 is a flowchart illustrating an exemplary method for fabricating a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underneath," "below," "lower," "above," "on," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides an exemplary semiconductor structure that may be used to form therein transistors, such as gate all around (GAA) field-effect transistors (FETs). The semiconductor structure includes a substrate, and a fin that extends from the substrate and that is formed with a hole therein. The present disclosure also provides an exemplary method for fabricating the semiconductor structure. The method includes processes by which the hole in the fin is formed in a gradual manner, as will be described in detail hereinafter.

FIG. 1 is a flowchart illustrating an exemplary method 100 for fabricating a semiconductor structure in accordance with some embodiments. At 110, a substrate, e.g., substrate 220 shown in FIGS. 2A and 2B, is provided. At 120, a fin, e.g., fin 520 shown in FIGS. 5A and 5B, is formed that extends from the substrate. At 130, an oxide layer, e.g., oxide layer 1510 shown in FIGS. 15A and 15C, is formed on the fin. At 140, the oxide layer is removed to form a pair of grooves, e.g., grooves 1610, 1620 shown in FIG. 16C, that respectively extend into opposite sides of the fin and that are defined by a groove-defining wall, e.g., groove-defining wall 1630 shown in FIG. 16C. At 150, an oxide layer, e.g., oxide layer 1710 shown in FIGS. 17A and 17C, is formed that extends through a thickness of the groove-defining wall of the fin. At 160, the oxide layer is removed to form a hole, e.g., hole 1810 shown in FIGS. 18A and 18C, that extends through the fin and that is defined by a hole-defining wall, e.g., hole-defining wall 1820 shown in FIGS. 18A and 18C. At 170, an oxide layer, e.g., oxide layer 1910 shown in FIGS. 19A and 19C, is formed on the hole-defining wall of the fin. At 180, the oxide layer is removed to enlarge the hole in the fin. At 190, the hole-defining wall of the fin is cleaned to remove a native oxide layer thereon, e.g., native oxide layer 2010 shown in FIGS. 20A and 20C.

FIG. 2A is a schematic longitudinal sectional view illustrating a stage in the fabrication of an exemplary semiconductor structure in accordance with some embodiments and FIG. 2B is a schematic sectional view taken along line 2B-2B' of FIG. 2A in accordance with some embodiments. In FIGS. 2A and 2B, there is shown an initial semiconductor structure that includes a substrate 220, a semiconductor strip 210, and an isolation layer 230. In an exemplary embodiment, the substrate 220 is a bulk silicon substrate. In another exemplary embodiment, the substrate 220 is a silicon-on-insulator (SOI) substrate. The semiconductor strip 210 extends vertically from and along the length of the substrate 220. The semiconductor strip 210 is formed by performing a sequence of lithographic and etching processes to form vertically extending trenches in an upper portion of the substrate 220, whereby the upper portion of the substrate 220 that is between a pair of the trenches forms the semiconductor strip 210. The lithographic and etching processes include, for example, spin-on coating a photoresist layer over the substrate 220, exposing the photoresist layer to a pattern, post-exposure baking the photoresist layer, developing the photoresist layer, etching the upper portion of the substrate 220 using the photoresist layer as an etching mask, and removing the photoresist layer.

The isolation layer 230 surrounds the semiconductor strip 210. The isolation layer 230 is formed, for example, by first performing a shallow trench isolation (STI) process to fill the trenches in the upper portion of the substrate 220 with an STI material, such as an oxide, and then by performing a chemical mechanical polishing (CMP) process to remove the STI material that is on a top surface of the semiconductor strip 210, whereby the STI material that is in the trenches forms the isolation layer 230.

FIG. 3A is a schematic longitudinal sectional view illustrating another stage in the fabrication of the exemplary semiconductor structure in accordance with some embodiments and FIG. 3B is a schematic sectional view taken along line 3B-3B' of FIG. 3A in accordance with some embodiments. In FIGS. 3A and 3B, an opening 310 is formed that is defined by the isolation layer 230 after removal of an upper portion of the semiconductor strip 210. The upper portion of the semiconductor strip 210 is removed by performing an etch-back process on the semiconductor strip 210. The etch-back process is a dry etch-back process, another suitable anisotropic etch-back process, or a combination thereof. The etch-back process uses $NF_3$, another suitable gas mixture, or a combination thereof.

FIG. 4A is a schematic longitudinal sectional view illustrating another stage in the fabrication of the exemplary semiconductor structure in accordance with some embodiments and FIG. 4B is a schematic sectional view taken along line 4B-4B' of FIG. 4A in accordance with some embodiments. In FIGS. 4A and 4B, a middle semiconductor strip 410 is formed that partially fills the opening 310 in the isolation layer 230. As best shown in FIG. 4A, the middle semiconductor strip 410 extends vertically from and along the length of the semiconductor strip 210. The middle semiconductor strip 410 is formed by an epitaxial growth process, where an alloy of semiconductor materials is grown on the semiconductor strip 210. In an exemplary embodiment, the alloy of semiconductor materials is an alloy of Si and Ge. In such an exemplary embodiment, the SiGe alloy has a concentration of $Si_{(1-x)}Ge_{(x)}$, where x is about 0.2 to about 0.5. The epitaxial growth process is a chemical vapor deposition (CVD) process, a derivative thereof, such as vapor phase epitaxy (VPE) or ultra-high vacuum CVD (UHV-CVD), another suitable deposition process, or a combination thereof. The epitaxial growth process uses $SiH_2Cl_2$, $SiH_4$, $GeH_4$, another suitable gas mixture, or a combination thereof.

FIG. 5A is a schematic longitudinal sectional view illustrating another stage in the fabrication of the exemplary semiconductor structure in accordance with some embodiments and FIG. 5B is a schematic sectional view taken along line 5B-5B' of FIG. 5A in accordance with some embodiments. In FIGS. 5A and 5B, a top semiconductor strip 510 is formed that substantially fills the opening 310 in the isolation layer 230. As best shown in FIG. 5A, the top semiconductor strip 510 extends vertically from and along the length of the middle semiconductor strip 410. The top semiconductor strip 510 is formed by an epitaxial growth process, where an elementary semiconductor material is grown on the middle semiconductor strip 410. In an exemplary embodiment, the elementary semiconductor material is Si. The epitaxial growth process is a CVD process, a derivative thereof, another suitable deposition process, or a combination thereof. The epitaxial growth process uses $SiH_2Cl_2$, $SiH_4$, another suitable gas mixture, or a combination thereof. Following the formation of the top semiconductor strip 510, a CMP process is performed to planarize and smoothen the top semiconductor strip 510 and the isolation layer 230.

The semiconductor strip 210, the middle semiconductor strip 410, and the top semiconductor strip 510 constitute a fin 520. In an exemplary embodiment, the fin 520 has a width of about 12 nanometers to about 20 nanometers.

FIG. 6A is a schematic longitudinal sectional view illustrating another stage in the fabrication of the exemplary semiconductor structure in accordance with some embodiments and FIG. 6B is a schematic sectional view taken along line 6B-6B' of FIG. 6A in accordance with some embodiments. In FIGS. 6A and 6B, an upper portion of the isolation layer 230 is removed such that the isolation layer 230 is above the semiconductor strip 210 and below the top semiconductor strip 510. In an exemplary embodiment, a distance between a top surface of the isolation layer 230 and a top surface of the middle semiconductor strip 410 is about 15 nanometers to about 25 nanometers. The upper portion of the isolation layer 230 is removed using a dry etch-back process, another suitable anisotropic etching process, or a combination thereof. The dry etch-back process uses HF, $NH_3$, another suitable gas mixture, or a combination thereof.

FIG. 7A is a schematic longitudinal sectional view illustrating another stage in the fabrication of the exemplary semiconductor structure in accordance with some embodiments and FIG. 7B is a schematic sectional view taken along line 7B-7B' of FIG. 7A in accordance with some embodiments. In FIGS. 7A and 7B, a covering layer 710 is formed over the isolation layer 230 and the fin 520. The covering layer 710 is formed in a conformal manner. That is, as best shown in FIGS. 7A and 7B, the covering layer 710 that is on the isolation layer 230, the covering layer 710 that is on a sidewall of the fin 520, and the covering layer 710 that is on a top surface of the fin 520, in an exemplary embodiment, all have a substantially same thickness. The covering layer 710 is formed by an atomic layer deposition (ALD) process, a derivative thereof, another suitable deposition process, or a combination thereof.

FIG. 8A is a schematic longitudinal sectional view illustrating another stage in the fabrication of the exemplary semiconductor structure in accordance with some embodiments and FIG. 8B is a schematic sectional view taken along line 8B-8B' of FIG. 8A in accordance with some embodiments. In FIGS. 8A and 8B, a poly strip 810 is formed that extends vertically from the covering layer 710 and transversely to the length of the fin 520. Further, in FIGS. 8A and 8B, a hardmask layer 820 is formed over the poly strip 810. The poly strip 810 is formed by: forming a polycrystalline semiconductor material, e.g., polycrystalline silicon, over the covering layer 710; forming a first dielectric material, e.g., nitride, over the polycrystalline semiconductor material; forming a second dielectric material, e.g., oxide, over the first dielectric material; patterning the first and second dielectric materials, whereby the patterned first and second dielectric materials form the hardmask layer 820; and using the hardmask layer 820 as an etching mask, performing an etching process on the polycrystalline semiconductor material. The etching process is a dry etching process, another suitable anisotropic etching process, or a combination thereof. The etching process uses HBr, another suitable gas mixture, or a combination thereof.

Figure 9A:
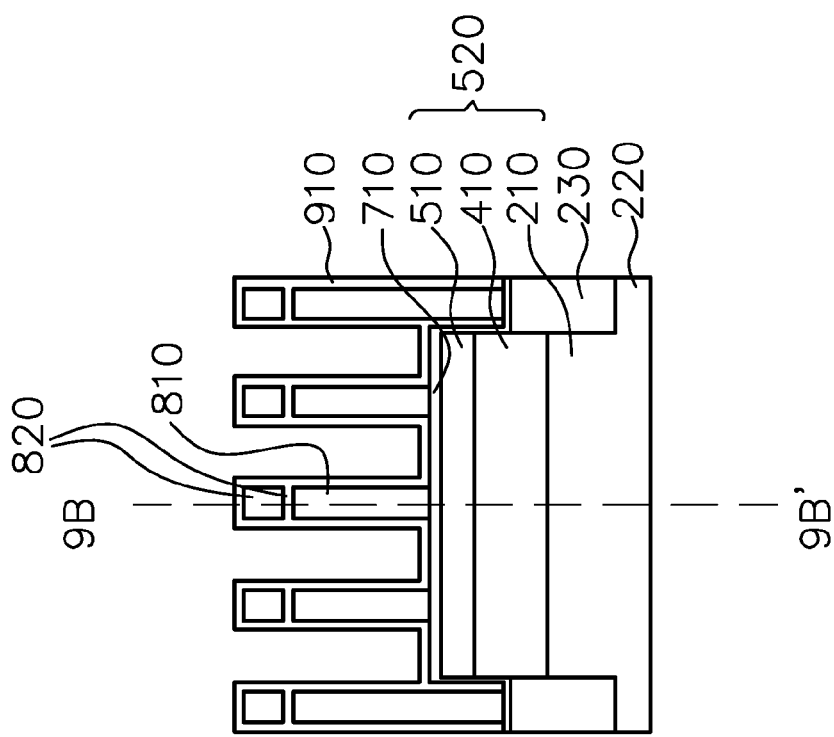
FIG. 9A is schematic longitudinal sectional view illustrating another stage in the fabrication of the exemplary semiconductor structure in accordance with some embodiments.
Figure 9B:
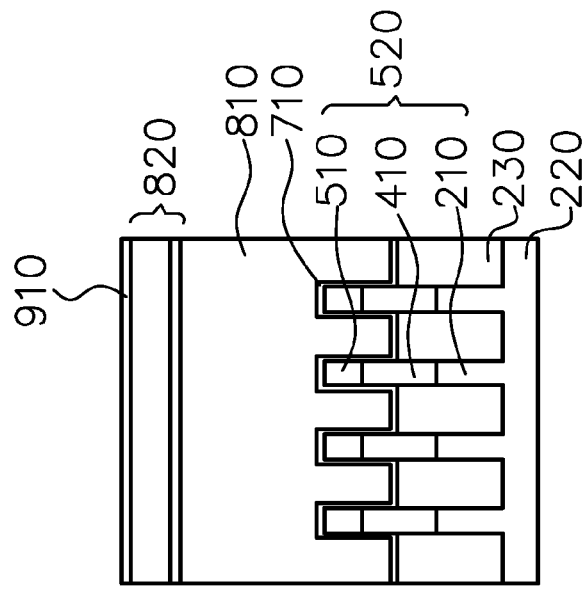
FIG. 9B is a schematic sectional view taken along line 9B-9B' of FIG. 9A in accordance with some embodiments.

FIG. 9A is a schematic longitudinal sectional view illustrating another stage in the fabrication of the exemplary semiconductor structure in accordance with some embodiments and FIG. 9B is a schematic sectional view taken along line 9B-9B' of FIG. 9A in accordance with some embodiments. In FIGS. 9A and 9B, a spacer 910 is conformably formed on the covering layer 710, sidewalls of the poly strip 810 and the hardmask layer 820, and a top surface of the hardmask layer 820. Examples of materials for the spacer 910 include, but are not limited to, SiN and SiCN.

FIG. 10A is a schematic longitudinal sectional view illustrating another stage in the fabrication of the exemplary semiconductor structure in accordance with some embodiments and FIG. 10B is a schematic sectional view taken along line 10B-10B' of FIG. 10A in accordance with some embodiments. In FIG. 10A, a pair of recesses 1010, 1020 are formed that extend through the spacer 910 and the covering layer 710 and into the top semiconductor strip 510. The recesses 1010, 1020 are formed using a dry etching process, another suitable anisotropic etching process, or a combination thereof. The etching process uses HBr, $O_2$, $NF_3$, $Cl_2$, another suitable gas mixture, or a combination thereof. Further, in FIGS. 10A and 10B, the dry etching process causes removal of the spacer 910 that is on the top surface of the hardmask layer 820.

FIG. 11A is a schematic longitudinal sectional view illustrating another stage in the fabrication of the exemplary semiconductor structure in accordance with some embodiments and FIG. 11B is a schematic sectional view taken along line 11B-11B' of FIG. 11A in accordance with some embodiments. In FIG. 11A, a pair of source/drain regions 1110, 1120, each of which is formed in a respective one of the recesses 1010, 1020. The source/drain regions 1110, 1120 may be used to form an FET. In an exemplary embodiment, the source/drain regions 1110, 1120 are formed by performing an epitaxial growth process, where SiP is grown on the top semiconductor strip 510. In such an exemplary embodiment, the source/drain regions 1110, 1120 may be used to form an N-channel FET. In another exemplary embodiment, the source/drain regions 1110, 1120 are formed by performing an epitaxial growth process, where SiGeB is grown on the top semiconductor strip 510. In such another exemplary embodiment, the source/drain regions 1110, 1120 may be used to form a P-channel FET.

FIG. 12A is a schematic longitudinal sectional view illustrating another stage in the fabrication of the exemplary semiconductor structure in accordance with some embodiments and FIG. 12B is a schematic sectional view taken along line 12B-12B' of FIG. 12A in accordance with some embodiments. In FIGS. 12A and 12B, an interlayer dielectric (ILD) layer 1210 is blanket deposited over the structure of FIGS. 11A and 11B. Examples of materials for the ILD layer 1210 include, but are not limited to, $SiO_2$ and SiN.

Figure 13A:
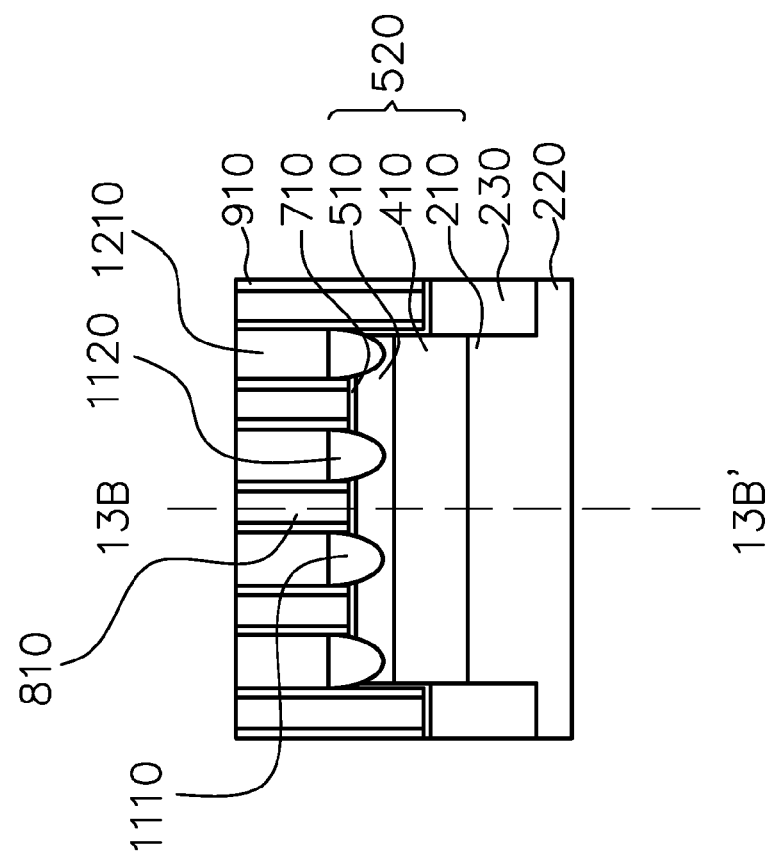
FIG. 13A is a schematic longitudinal sectional view illustrating another stage in the fabrication of the exemplary semiconductor structure in accordance with some embodiments.
Figure 13B:
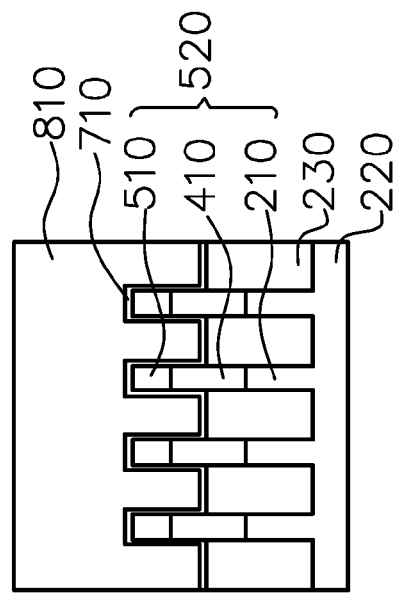
FIG. 13B is a schematic sectional view taken along line 13B-13B' of FIG. 13A in accordance with some embodiments.

FIG. 13A is a schematic longitudinal sectional view illustrating another stage in the fabrication of the exemplary semiconductor structure in accordance with some embodiments and FIG. 13B is a schematic sectional view taken along line 13B-13B' of FIG. 13A in accordance with some embodiments. In FIGS. 13A and 13B, the poly strip 810, the spacer 910, and the ILD layer 1210 are planarized and smoothen using a CMP process, whereby the hardmask layer 820 is removed from the structure.

FIG. 14A is a schematic longitudinal sectional view illustrating another stage in the fabrication of the exemplary semiconductor structure in accordance with some embodiments and FIG. 14B is a schematic sectional view taken along line 14B-14B' of FIG. 14A in accordance with some embodiments. In FIG. 14A, a region 1410 of the fin 520 is exposed after removal of the poly strip 810 and the covering layer 710 that overly the region 1410. In an exemplary embodiment, the region 1410 has a width of about 20 nanometers to about 900 nanometers. The poly strip 810 that overlies the region 1410 may be removed via a wet etching process using $NH_3$, diluted hydrofluoric acid, another suitable aqueous mixture, or a combination thereof. The poly strip 810 that overlies the region 1410 may be also removed via dry etching process using HBr, another suitable gaseous mixture, or a combination thereof. The covering layer 710 that overlies the region 1410 is removed via a dry etching process using hydrofluoric acid (HF), $NH_3$, another suitable gaseous mixture, or a combination thereof.

FIG. 15A is a schematic longitudinal sectional view illustrating another stage in the fabrication of the exemplary semiconductor structure in accordance with some embodiments, FIG. 15B is a schematic sectional view taken along line 15B-15B' of FIG. 15A in accordance with some embodiments, and FIG. 15C is a magnified schematic sectional view of the fin 520 shown in FIG. 15B in accordance with some embodiments. In FIGS. 15A and 15C, an oxide layer 1510 is formed on the middle and top semiconductor strips 410, 510 of the fin 520 that are in the region 1410. The oxide layer 1510 is formed by performing a first oxidation process using an $H_2O_2$ and $H_2SO_4$ mixture (SPM) that has a volume ratio of $H_2O_2$ to $H_2SO_4$ of about 1:3, at a temperature of at least about 80 degrees Celsius, and for at least about 10 seconds. In an exemplary embodiment, the first oxidation process uses an SPM that has a volume ratio of $H_2O_2$ to $H_2SO_4$ of about 1:3, and is conducted at a temperature of about 80 degrees Celsius and for about 20 seconds. In an exemplary embodiment, the middle and top semiconductor strips 410, 510 are formed of SiGe and Si, respectively. In such an exemplary embodiment, the oxide layer 1510 that is on the middle semiconductor strip 410 is SiGeOx and the oxide layer 1510 that is on the top semiconductor strip 510 is SiOx.

FIG. 16A is a schematic longitudinal sectional view illustrating another stage in the fabrication of the exemplary semiconductor structure in accordance with some embodiments, FIG. 16B is a schematic sectional view taken along line 16B-16B' of FIG. 16A in accordance with some embodiments, and FIG. 16C is a magnified schematic sectional view of the fin 520 shown in FIG. 16B in accordance with some embodiments. In FIG. 16C, a pair of grooves 1610, 1620 are formed that respectively extend into opposite sides of the middle semiconductor strip 410 of the fin 520 and that are defined by a groove-defining wall 1630 after removal of the oxide layer 1510 that is on the middle semiconductor strip 410. The oxide layer 1510 is removed by performing a first etching process. The first etching process is a wet etching process, another isotropic etching process, or a combination thereof. The first etching process uses an $NH_4OH$, $H_2O_2$, and de-ionized water (DIW) mixture (SC-1) that has a volume ratio of $NH_4OH$ to $H_2O_2$ to DIW of about 1:8:60, and is conducted at a temperature of at least about 25 degrees Celsius and for at least about 1 minute. In an exemplary embodiment, the first etching process uses an SC-1 that has a volume ratio of $NH_4OH$ to $H_2O_2$ to DIW of about 1:8:60, and is conducted at a temperature of about 60 degrees Celsius and for about 4 minutes. Further, in FIGS. 16A and 16C, the first etching process causes formation of a native oxide layer 1640 on the groove-defining wall 1630 of the middle semiconductor strip 410. In an exemplary embodiment, the middle semiconductor strip 410 is formed of SiGe. In such an exemplary embodiment, the oxide layer 1640 is SiGeOx.

It is noted that the oxide layer 1510, e.g., SiOx, that is on the top semiconductor strip 510 is substantially etch resistant to the SC-1. As such, the first etching process does not substantially etch the oxide layer 1510.

It is also noted that, during the first etching process, aside from a perpendicular etch, a lateral etch also occurs. As such, the grooves 1610, 1620 extend beyond lateral sides of the region 1410.

FIG. 17A is a schematic longitudinal sectional view illustrating another stage in the fabrication of the exemplary semiconductor structure in accordance with some embodiments, FIG. 17B is a schematic sectional view taken along line 17B-17B' of FIG. 17A in accordance with some embodiments, and FIG. 17C is a magnified schematic sectional view of the fin 520 shown in FIG. 17B in accordance with some embodiments. In FIGS. 17A and 17C, an oxide layer 1710 is formed that extends through a thickness of the groove-defining wall 1630 of the middle semiconductor strip 410 of the fin 520. The oxide layer 1710 is formed by performing a second oxidation process. The second oxidation process is a dry ashing process, another suitable dry ashing process, or a combination thereof. The second oxidization process uses $O_2$, and is conducted at a temperature of at least about 60 degrees Celsius, an $O_2$ flow of at least about 200 sccm, a pressure of at least about 10 mT, a power of at least about 700 W, and a bias voltage of about 0 to about 40 Volts, and for at least about 2 minutes. In an exemplary embodiment, the second oxidization process uses $O_2$, and is conducted at a temperature of about 60 degrees Celsius, an $O_2$ flow of about 200 sccm, a pressure of about 10 mT, a power of about 700 W, and a bias voltage of about 40 Volts, and for about 2 minutes.

In an exemplary embodiment, the middle semiconductor strip 410 is formed of SiGe. In such an exemplary embodiment, the oxide layer 1710 is SiGeOx.

FIG. 18A is a schematic longitudinal sectional view illustrating another stage in the fabrication of the exemplary semiconductor structure in accordance with some embodiments, FIG. 18B is a schematic sectional view taken along line 18B-18B' of FIG. 18A in accordance with some embodiments, and FIG. 18C is a magnified schematic sectional view of the fin 520 shown in FIG. 18B in accordance with some embodiments. In FIGS. 18A and 18C, a hole 1810 is formed that extends through the fin 520 and that is defined by a hole-defining wall 1820 after removal of the oxide layers 1510, 1640, 1710. The oxide layers 1510, 1640, 1710 are removed by performing a first cleaning process. The first cleaning process is a wet cleaning process, another isotropic cleaning process, or a combination thereof. The first cleaning process uses a diluted hydrofluoric acid (DHF) that has a volume ratio of hydrofluoric acid to DIW of about 1:100, and is conducted at a temperature of at least about 25 degrees Celsius and for at least about 15 seconds. In an exemplary embodiment, the first cleaning process uses a DHF that has a volume ratio of hydrofluoric acid to DIW of about 1:100, and is conducted at a temperature of about 25 degrees Celsius and for about 20 seconds.

FIG. 19A is a schematic longitudinal sectional view illustrating another stage in the fabrication of the exemplary semiconductor structure in accordance with some embodiments, FIG. 19B is a schematic sectional view taken along line 19B-19B' of FIG. 19A in accordance with some embodiments, and FIG. 19C is a magnified schematic sectional view of the fin 520 shown in FIG. 19B in accordance with some embodiments. In FIGS. 19A and 19C, an oxide layer 1910 is formed on the hole-defining wall 1820 of the fin 520. The oxide layer 1910 is formed by performing a third oxidation process. The third oxidation process uses a SPM that has a volume ratio of $H_2O_2$ to $H_2SO_4$ of about 1:3, and is conducted at a temperature of at least about 80 degrees Celsius and for at least about 10 seconds. In an exemplary embodiment, the third oxidation process uses an SPM that has a volume ratio of $H_2O_2$ to $H_2SO_4$ of about 1:3, and is conducted at a temperature of about 80 degrees Celsius and for about 20 seconds. In one exemplary embodiment, the middle and top semiconductor strips 410, 510 are formed of SiGe and Si, respectively. In such one exemplary embodiment, the oxide layer 1910 that is on the middle semiconductor strip 410 is SiGeOx and the oxide layer 1910 that is on the top semiconductor strip 510 is SiOx.

FIG. 20A is a schematic longitudinal sectional view illustrating another stage in the fabrication of the exemplary semiconductor structure in accordance with some embodiments, FIG. 20B is a schematic sectional view taken along line 20B-20B' of FIG. 20A in accordance with some embodiments, and FIG. 20C is a magnified schematic sectional view of the fin 520 shown in FIG. 20B in accordance with some embodiments. In FIGS. 20A and 20C, the hole 1810 in the fin 520 is enlarged after removal of the oxide layer 1910 that is on the middle semiconductor strip 410 of the fin 520. The oxide layer 1910 that is on the middle semiconductor strip 410 of the fin 520 is removed by performing a second etching process. The second etching process uses a SC-1 that has a volume ratio of $NH_4OH$ to $H_2O_2$ to DIW of about 1:8:60, and is conducted at a temperature of at least about 25 degrees Celsius and for at least about 2 minutes. In an exemplary embodiment, the second etching process uses an SC-1 that has a volume ratio of $NH_4OH$ to $H_2O_2$ to DIW of about 1:8:60, and is conducted at a temperature of about 60 degrees Celsius and for about 8 minutes. Further, in FIG. 20C, the second etching process causes formation of a native oxide layer 2010 on the hole-defining wall 1820 of the fin 520. In an exemplary embodiment, the middle semiconductor strip 410 is formed of SiGe. In such an exemplary embodiment, the oxide layer 2010 is SiGeOx.

It is noted herein that the oxide layer 1910, e.g., SiOx, that is on the top semiconductor strip 510 is substantially etch resistant to the SC-1. As such, the second etching process does not substantially etch the oxide layer 1910.

FIG. 21A is a schematic longitudinal sectional view illustrating another stage in the fabrication of the exemplary semiconductor structure in accordance with some embodiments, FIG. 21B is a schematic sectional view taken along line 21B-21B' of FIG. 21A in accordance with some embodiments, and FIG. 21C is a magnified schematic sectional view of the fin 520 shown in FIG. 21B in accordance with some embodiments. In FIGS. 21A and 21C, there is shown the resulting semiconductor structure 2100 after removal of the oxide layers 1910, 2010 that are on the hole-defining wall 1820 of the fin 520. The oxide layers 1910, 2010 are removed by performing a second cleaning process. The second cleaning process is a wet cleaning process, another isotropic cleaning process, or a combination thereof. The second cleaning process uses a DHF that has a volume ratio of hydrofluoric acid to DIW of about 1:100, and is conducted at a temperature of at least about 25 degrees Celsius and for at least about 15 seconds. In an exemplary embodiment, the second cleaning process uses a DHF that has a volume ratio of hydrofluoric acid to DIW of about 1:100, and is conducted at a temperature of about 25 degrees Celsius and for about 20 seconds.

Referring to FIG. 21A, the hole-defining wall 1820 of the fin 520 includes a confronting pair of wall parts 2110, 2120.

In an exemplary embodiment, the wall part 2110 is substantially more arcuate than the wall part 2120.

Still referring to FIG. 21A, the fin 520 is further formed with a pair of holes 2130, 2140 therethrough, each of which is defined by a hole-defining wall 2150, 2160, and each of which is formed by the processes described above with reference to FIGS. 15A-21C. In an exemplary embodiment, the hole-defining walls 1820, 2150, 2160 of the fin 520 have a substantially same shape.

The top semiconductor strip 510 that is between the source/drain regions 1110, 1120 serves as a channel for the source/drain regions 1110, 1120. As such, the semiconductor structure 2100 may be used to form a GAA FET. For example, the channel may be first rounded to form a nanowire, and then a gate stack may be formed around the nanowire. The gate stack may include a high-k interfacial layer formed on the nanowire, and a metal gate formed on the high-k interfacial layer. It is noted that, since the channel of the semiconductor structure 2100 is horizontally oriented, the GAA FET formed in the semiconductor structure 2100 may be termed as a horizontal GAA FET (HGAA FET).

From the above description, since the hole 1810 is gradually formed through the fin 520 using the processes of the present disclosure as described above with reference to FIGS. 15A-21C, the hole-defining wall 1820 of the fin 520 has relatively smooth wall surface and wall periphery. As such, an enhanced performance may be obtained for a HGAA FET that may formed in the semiconductor structure 2100 of the present disclosure.

In an embodiment of a semiconductor structure, the semiconductor structure includes a substrate and a fin. The fin extends from the substrate, and is formed with a hole therethrough that is defined by a confronting pair of wall parts. One of the wall parts is more arcuate than the other of the wall parts.

In another embodiment of a semiconductor structure, the semiconductor structure includes a substrate and a fin. The fin extends from the substrate, and is formed with a plurality of holes therethrough, each of which is defined by a hole-defining wall. The hole-defining walls of the fin have a substantially same shape.

In an embodiment of a method for fabricating a semiconductor structure, a substrate is provided. A plurality of trenches is formed, each of which extends into the substrate. The substrate that is between a pair of the trenches forms a semiconductor strip. A middle semiconductor strip is formed over the semiconductor strip. A top semiconductor strip is formed over the middle semiconductor strip. The semiconductor strip, the middle semiconductor strip, and the top semiconductor strip constitute a fin. A groove is formed that extends into the fin and that is defined by a groove-defining wall. The groove-defining wall of the fin is removed to form a hole that extends through the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method comprising:
   forming a pair of the trenches to define a semiconductor strip;
   forming a middle semiconductor strip over the semiconductor strip;
   forming a top semiconductor strip over the middle semiconductor strip, wherein the semiconductor strip, the middle semiconductor strip, and the top semiconductor strip comprise a fin;
   forming an oxide layer that extends through a thickness of the fin; and
   removing the oxide layer to form a hole that extends through the fin and that is surrounded by the fin.

2. The method of claim 1, wherein the removing includes using a diluted hydrofluoric acid (DHF).

3. The method of claim 2, wherein the DHF has a volume ratio of hydrofluoric acid to de-ionized water (DIW) of about 1:100.

4. The method of claim 1, wherein the forming of the oxide layer uses a mixture (SPM) of $H_2O_2$ and $H_2SO_4$.

5. The method of claim 4, wherein the SPM has a volume ratio of $H_2O_2$ to $H_2SO_4$ of about 1:3.

6. The method of claim 1, further comprising enlarging the hole.

7. The method of claim 6, wherein the enlarging includes using a mixture (SC-1) of $NH_4OH$, $H_2O_2$, and de-ionized water (DIW).

8. The method of claim 7, wherein the SC-1 has a volume ratio of $NH_4OH$ to $H_2O_2$ to de-ionized water (DIW) of about 1:8:60.

9. The method of claim 1, further comprising cleaning the hole.

10. The method of claim 9, wherein the cleaning uses diluted hydrofluoric acid (DHF).

11. The method of claim 1, wherein the oxide layer extends through a thickness of the middle semiconductor strip.

12. The method of claim 1, further comprising cleaning the hole-defining wall of the fin.

13. A method comprising:
    forming a semiconductor strip;
    forming a middle semiconductor strip over the semiconductor strip;
    forming a top semiconductor strip over the middle semiconductor strip, wherein the semiconductor strip, the middle semiconductor strip, and the top semiconductor strip comprise a fin;
    forming, using a mixture (SPM) of $H_2O_2$ and $H_2SO_4$, an oxide layer that extends through a thickness of the fin; and
    removing the oxide layer to form a hole that extends through the fin and that is surrounded by the fin.

14. The method of claim 13, wherein the SPM has a volume ratio of $H_2O_2$ to $H_2SO_4$ of about 1:3.

15. The method of claim 13, wherein the removing includes using diluted hydrofluoric acid (DHF).

16. The method of claim 13, further comprising enlarging the hole using a mixture (SC-1) of $NH_4OH$, $H_2O_2$ and de-ionized water (DIW).

17. The method of claim 13, further comprising cleaning the hole.

18. The method of claim 17, wherein the cleaning uses diluted hydrofluoric acid (DHF).

19. A method comprising:
    forming a semiconductor strip;
    forming a middle semiconductor strip over the semiconductor strip;

forming a top semiconductor strip over the middle semiconductor strip, wherein the semiconductor strip, the middle semiconductor strip, and the top semiconductor strip comprise a fin;

forming an oxide layer that extends through a thickness of the fin; and removing the oxide layer, using a diluted hydrofluoric acid (DHF), to form a hole that extends through the fin and that is surrounded by the fin.

20. The method of claim 19, wherein the DHF has a volume ratio of hydrofluoric acid to distilled water of about 1:100.

* * * * *